United States Patent [19]

Yang

[11] Patent Number: 5,793,460
[45] Date of Patent: Aug. 11, 1998

[54] LIQUID CRYSTAL DISPLAY DEVICE AND METHOD FOR MANUFACTURING THE SAME

[75] Inventor: Myoung-Su Yang, Kyungki-do, Rep. of Korea

[73] Assignee: LG Electronics Inc., Seoul, Rep. of Korea

[21] Appl. No.: 697,344

[22] Filed: Aug. 22, 1996

[30] Foreign Application Priority Data

Aug. 22, 1995 [KR] Rep. of Korea ............... 1995/25947

[51] Int. Cl.⁶ ........................ G02F 1/1343; G02F 1/1333
[52] U.S. Cl. ........................ 349/148; 348/147; 348/138
[58] Field of Search ........................ 349/138, 42, 43, 349/46, 143, 147, 148, 54

[56] References Cited

U.S. PATENT DOCUMENTS 5,212,574  5/1993  Katayama et al. ................ 349/148
5,424,857  6/1995  Aoki et al. ................ 349/147
5,614,730  3/1997  Nakazawa et al. ................ 349/42
5,650,834  7/1997  Nakagawa et al. ................ 349/147

FOREIGN PATENT DOCUMENTS 3-11318  1/1991  Japan ................ 349/148

Primary Examiner—William L. Sikes
Assistant Examiner—Tsep H. Nguyen
Attorney, Agent, or Firm—Morgan, Lewis & Bockius LLP

[57] ABSTRACT

A liquid crystal display device includes a plurality of scanning lines, having a first scanning line part and a second scanning line part, over a substrate and a plurality of signal lines formed over the substrate and crossing the scanning line at the first scanning line part. The first scanning line part is formed of a material that is different from a low resistance metal. The second scanning line part and the signal line are formed of the low resistance metal. The first scanning line part is connected to the second part of the scanning line through a contact hole.

36 Claims, 8 Drawing Sheets

LIQUID CRYSTAL DISPLAY DEVICE AND METHOD FOR MANUFACTURING THE SAME

BACKGROUND OF THE INVENTION

1. Field of the Invention

The present invention relates to a liquid crystal display (LCD) device and a method for manufacturing the same, and more particularly, to a liquid crystal display having a thin film transistor (TFT) and a method for manufacturing the same.

2. Discussion of the Related Art

In a conventional liquid crystal display device, as shown in FIG. 1A, a scanning line 2' and a signal line 6" are formed so as to cross each other. A TFT is constructed from a gate electrode 2, source and drain electrodes 6 and 6', respectively, and a semiconductor active layer 4. Here, the gate electrode 2 is connected to the scanning line 2'. The source electrode 6 is formed over one side of the gate electrode 2 and connected to the signal line 6". The drain electrode 6' is formed over the other side of the gate electrode 2. A pixel electrode 7 is connected to the drain electrode 6' of the TFT.

FIG. 1B shows the cross-sectional structure taken along line I-I' in FIG. 1A. Referring to FIG. 1B, a method for manufacturing the conventional liquid crystal display device will be described below.

A gate electrode 2 and a scanning line 2' are formed on a substrate 1. A gate insulating film 3, a semiconductor active layer 4, and an impurity-doped semiconductor layer 5 are sequentially deposited on the entire surface. The impurity-doped semiconductor layer 5 and the semiconductor active layer 4 are patterned to form a predetermined active layer pattern. A transparent conductive film is formed on the substrate and patterned to form a pixel electrode 7. Then, a metal for source and drain electrodes is deposited and patterned to form a source electrode 6, a drain electrode 6' and a signal line 6".

In forming the gate electrode 2 and the scanning line 2', the conventional method has the following problem.

If the gate electrode 2 and the scanning line 2' are formed using chromium (Cr) or other high refractory metal, the resistivity of such a metal is so high that a signal time delay occurs in the scanning line 2'. Therefore, it is difficult to realize a TFT-LCD having large area and high definition.

If the gate electrode 2 and the scanning line 2' are formed using a low resistance metal having a low melting point, such as aluminum (Al), a hillock is easily generated. An anode oxidation process has been used to solve the hillock problem. For this purpose, a double insulating film formed by an anode oxidation (an anode oxide film+a nitride or oxide film) can be used as the gate insulating film. In this case, a photo process for blocking the pad, an anode oxidation process and a cleaning process are added to the process. Thus, the process has complicated steps. In addition, there is a possibility that a photoresist on the pad falls off during the anode oxidation, thereby reducing the yield due to the residual photoresist.

SUMMARY OF THE INVENTION

Accordingly, the present invention is directed to a liquid crystal display device and method for manufacturing the same that substantially obviates one or more of the problems due to limitations and disadvantages of the related art.

An object of the present invention is to provide a liquid crystal display device and a method for manufacturing the same that allow less signal delay and are more suitable for a TFT-LCD having large area and high definition.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a plurality of scanning lines, a plurality of signal lines perpendicularly crossing the plurality of scanning lines, a plurality of thin film transistors having a gate, a source and a drain in a cross point where the plurality of scanning lines and the plurality of signal lines are cross perpendicular to each other, and a pixel electrode connected to the drain electrode of the plurality of thin film transistor, wherein a part of the scanning lines cross to the signal line and the gate electrode of the thin film transistor are formed of a high refractory metal, the signal line, the source and drain electrodes of the thin film transistor, and the second scanning lines excluding the part cross to the signal lines are formed of a low resistance metal, and the second scanning lines excluding the part cross to the signal lines and the part of the scanning lines cross to the signal lines, and the gate electrode and the second scanning lines excluding the part cross to the signal lines are connected to each other through predetermined contact holes, respectively.

In another aspect, a liquid crystal display device includes a plurality of scanning lines, a plurality of signal lines cross perpendicular to the plurality of scanning lines, a plurality of thin film transistors having a gate, a source and a drain in a cross point where the plurality of scanning lines and the plurality of signal lines are cross perpendicular to each other, and a pixel electrode connected to the drain electrode of the plurality of thin film transistor, wherein a part of the scanning lines cross to the signal line and the gate electrode of the thin film transistor are formed of a high refractory metal or a polysilicon doped with a high concentration impurity, the signal line, the source and drain electrodes of the thin film transistor, and the second scanning lines excluding the part cross to the signal lines are formed of a low resistance metal, the second scanning lines excluding the part cross to the signal lines and the part of the scanning lines cross to the signal lines are connected to each other through a first contact hole, the gate electrode and the second scanning lines excluding the part cross to the signal lines are connected to each other through a second contact hole, and the source electrode and the drain electrode are connected to source and drain regions of an active layer of the thin film transistor through a third contact hole, respectively.

In another aspect, a method for manufacturing a liquid crystal display device includes the steps of forming a high refractory metal layer on a transparent insulating substrate, selectively patterning the high refractory metal layer to thereby form a gate electrode and a predetermined metal layer pattern, forming a gate insulating film on the entire surface of the substrate, sequentially forming a semiconductor layer and an impurity-doped semiconductor layer on the entire surface, selectively patterning the impurity-doped semiconductor layer and the semiconductor layer to thereby form an active layer of a thin film transistor and an ohmic contact layer, selectively forming a pixel electrode on the gate insulating film, selectively etching the gate insulating film to thereby form a first contact hole selectively exposing the metal layer pattern and a second contact hole selectively exposing the gate electrode, forming a low resistance metal layer on the entire surface of the substrate, and selectively patterning the low resistance metal layer to thereby form a signal line, a scanning line and a signal line respectively connected to the metal layer pattern and the gate electrode through the first contact hole and the second contact hole, and source/drain electrodes.

In another aspect, a method for manufacturing a liquid crystal display device includes the steps of forming a buffer layer on a transparent insulating substrate, forming a semiconductor layer on the buffer layer, patterning the semiconductor layer to thereby form an active layer of a thin film transistor, forming a gate insulating film on the entire surface of the substrate, forming a high refractory conductive film on the gate insulating film, patterning the high refractory conductive film to thereby form a gate electrode and a predetermined metal layer pattern, forming source and drain regions on both ends of the active layer by doping a high concentration impurity, forming an interlayer insulating film on the entire surface of the substrate, selectively etching the interlayer insulating film and the gate insulating film to thereby form a first contact hole exposing a predetermined part of the metal layer pattern, a second contact hole exposing a predetermined part of the gate electrode and a third contact hole exposing the source and drain regions of the active layer, respectively, selectively forming a pixel electrode on the interlayer insulating film, forming a low resistance metal layer on the entire surface of the substrate, and patterning the low resistance metal layer to thereby form a scanning line and a signal line respectively connected to the metal layer pattern and the gate electrode through the first contact hole and the second contact hole, and source/drain electrodes, simultaneously.

In a further aspect, a method for manufacturing a liquid crystal display device includes the steps of forming a high refractory metal layer on a transparent insulating substrate, patterning the high refractory metal layer to thereby form a gate electrode and a predetermined metal layer pattern, forming a gate insulating film on the entire surface of the substrate, sequentially forming a semiconductor layer and an insulating film on the entire surface, selectively patterning the insulating film to thereby form an etch stopper, forming an impurity-doped semiconductor layer on the substrate, patterning the semiconductor layer and the impurity-doped semiconductor layer to an active layer pattern of a thin film transistor, selectively forming a pixel electrode on the gate insulating film, selectively etching the gate insulating film to thereby form a first contact hole selectively exposing the metal layer pattern and a second contact hole selectively exposing the gate electrode, forming a low resistance metal layer on the entire surface of the substrate, and patterning the low resistance metal layer to thereby form a signal line, a scanning line and a signal line respectively connected to the metal layer pattern and the gate electrode through the first contact hole and the second contact hole, and source/drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
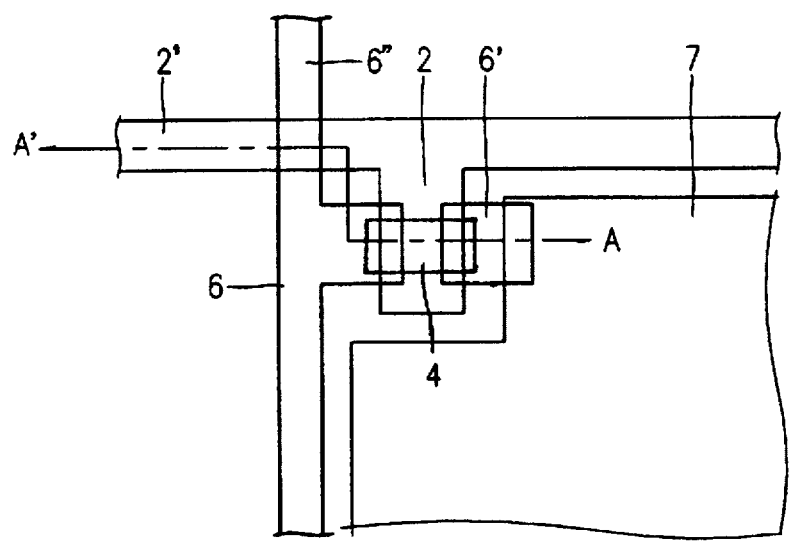
FIGS. 1A and 1B are plan and cross sectional views, respectively, showing the structure of a conventional liquid crystal display device.
Figure 1B:
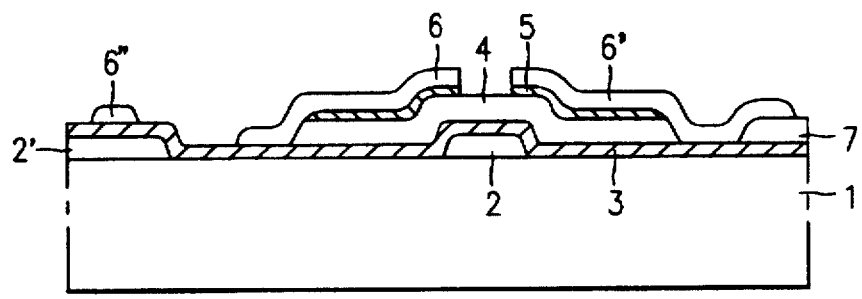
Figure 2A:
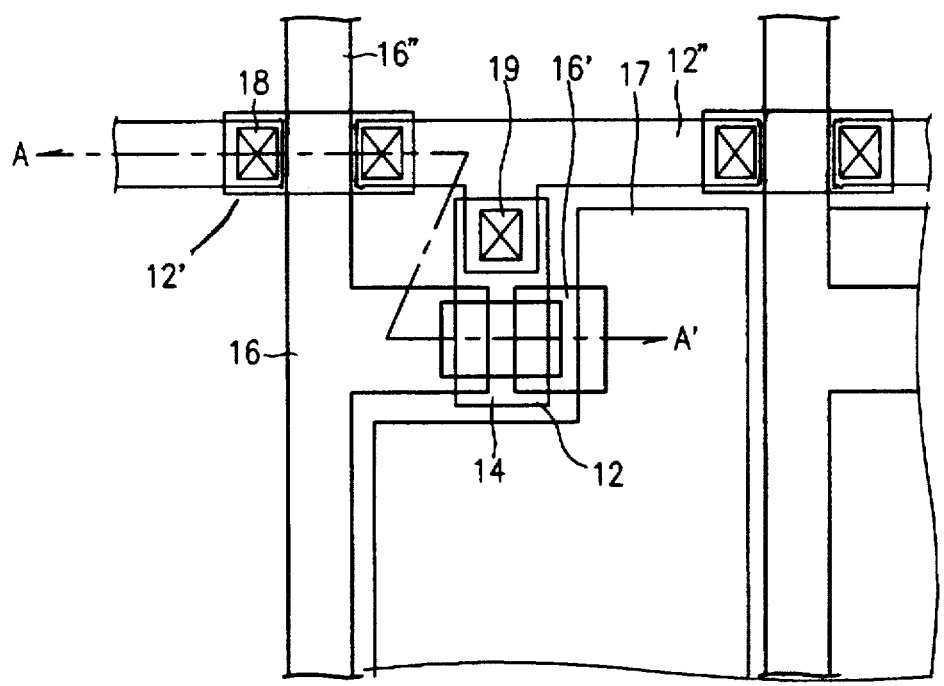
FIGS. 2A and 2B are plan and cross sectional views showing the structure of a liquid crystal display device according to a first embodiment of the present invention.
Figure 2B:
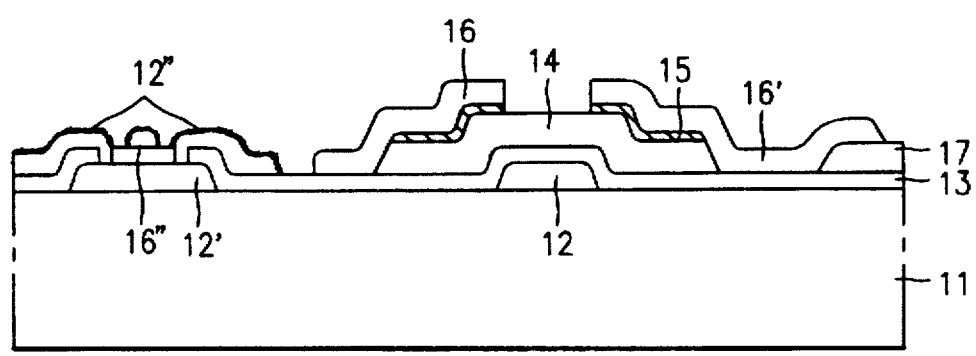

FIGS. 2A and 2B are plan and cross-sectional views of a liquid crystal display device according to a first embodiment of the present invention. FIG. 2B is a cross-sectional view taken along line II-II' in FIG. 2A.

In the liquid crystal display device according to the first embodiment of the present invention, a scanning line includes a first scanning line part 12' and a second scanning line part 12". The first scanning line 12' crosses a signal line 16". The first scanning line part 12' and a gate electrode 12 are formed of a high refractory metal. The signal line 16", a source electrode 16, a drain electrode 16', and the second scanning line part 12" are formed of a low resistance metal. The second scanning line 12" is connected to the first scanning line part 12' through a scanning line contact hole 18. The gate electrode 12 is connected to the second scanning line 12" through a gate electrode contact hole 19.

That is, the second scanning line 12" is formed between the two signal lines. The first scanning line part 12' is formed longer than the width of the signal line 16", providing a bridge structure at the intersection between the scanning line and the signal line 16". The first scanning line part 12' is connected to the second scanning line part 12" through the scanning line contact hole 18. The second scanning line part 12" also has a projecting part for making contact with the gate electrode 12 through the gate electrode contact hole 19.

The liquid crystal display device also includes an insulating substrate 11, a gate insulating film 13, an active layer 14, an ohmic contact layer 15, and a pixel electrode 17.

A method for manufacturing the liquid crystal display device according to the first embodiment of the present invention will be described below with reference to FIGS. 3A to 3E.

Figure 3A:
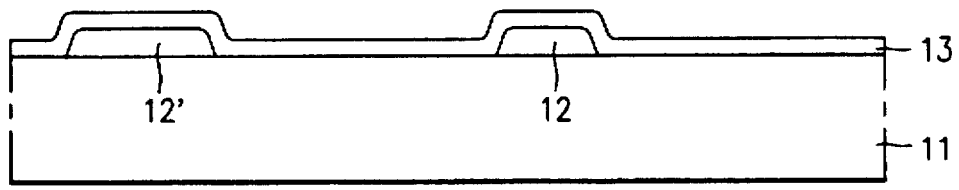
FIGS. 3A to 3E are cross sectional views illustrating a method for manufacturing the liquid crystal display device according to the first embodiment of the present invention.

As shown in FIG. 3A, a high refractory metal, such as Cr, Ta, W, or Ti, is deposited on an insulating substrate 11. Then, the high refractory metal is patterned to form a gate electrode 12 and a first scanning line part 12'. A gate insulating film 13 is formed on the entire surface. Here, the first scanning line part 12' is formed such that it crosses a signal line 16" to be formed in a later process.

Figure 3B:
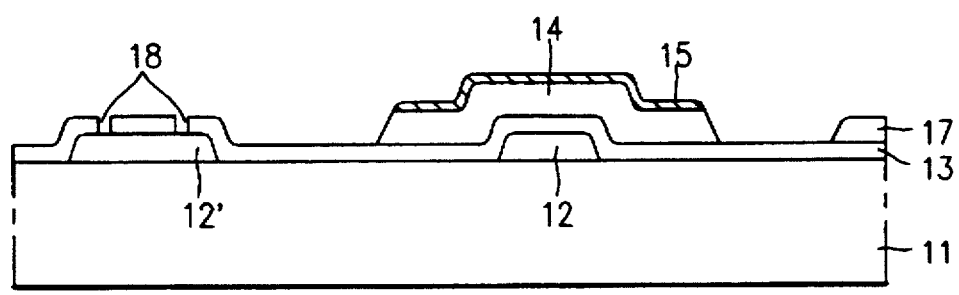

As shown in FIG. 3B, a semiconductor layer and an impurity-doped semiconductor layer are sequentially formed on the gate insulating film 13, and patterned to form an active layer 14 of a thin film transistor and an ohmic contact layer 15. Here, the active layer 14 and the ohmic contact layer 15 are formed over the gate electrode 12. Next, a transparent conductive layer is formed and patterned to a predetermined pattern, thereby forming a pixel electrode 17. Then, gate insulating film 13 is selectively etched to form a scanning line contact hole 18 exposing a predetermined part of the first scanning line part 12' and to form a gate electrode contact hole (see FIG. 2A) exposing a predetermined part of the gate electrode 12.

Figure 3C:
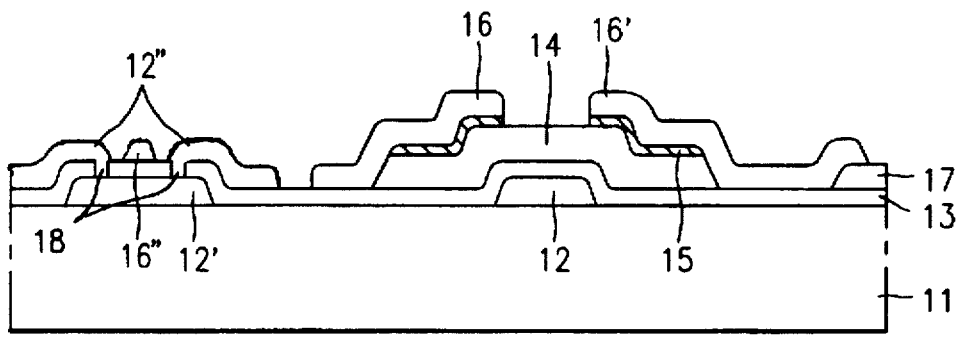

As shown in FIG. 3C, a low resistance metal layer is formed on the entire surface and patterned to form a signal line 16", a second scanning line 12", a source electrode 16, and a drain electrode 16', simultaneously. Here, the second scanning line 12" is connected to the first scanning line part 12' through the scanning line contact hole 18 and to the gate electrode 12 through the gate electrode contact hole 19.

A variation of the method described above is shown in FIG. 3D. In this case, before the pixel electrode 17 is formed, the low resistance metal layer is formed. The low resistance metal layer is then patterned to form a signal line 16", a second scanning line 12", a source electrode 16, and a drain electrode 16', simultaneously. Here, the second scanning line part 12" is connected to the first scanning line part 12' through the scanning line contact hole 18 and to the gate electrode 12 through the gate electrode contact hole 19.

An interlayer insulating film 18a is deposited on the entire surface. Then, a contact hole exposing a part of the drain electrode is formed in the interlayer insulating film. Finally, a transparent conductive layer is formed on the entire surface and patterned to a predetermined pattern, thereby forming a pixel electrode 17. A protective insulating film 18b for passivation is then formed.

Figure 3D:
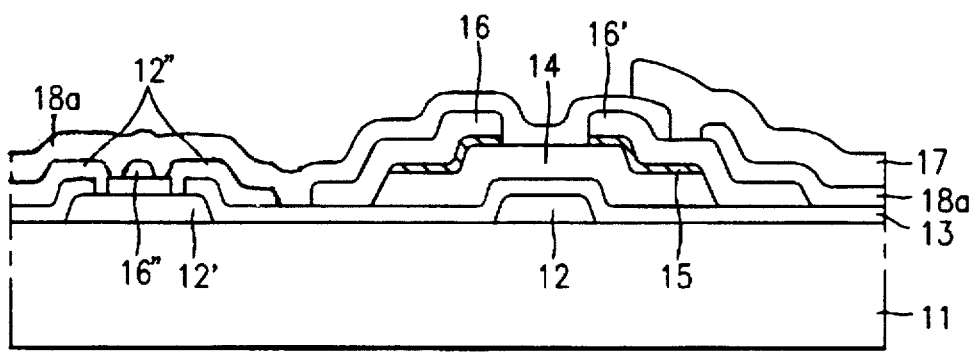
Figure 3E:
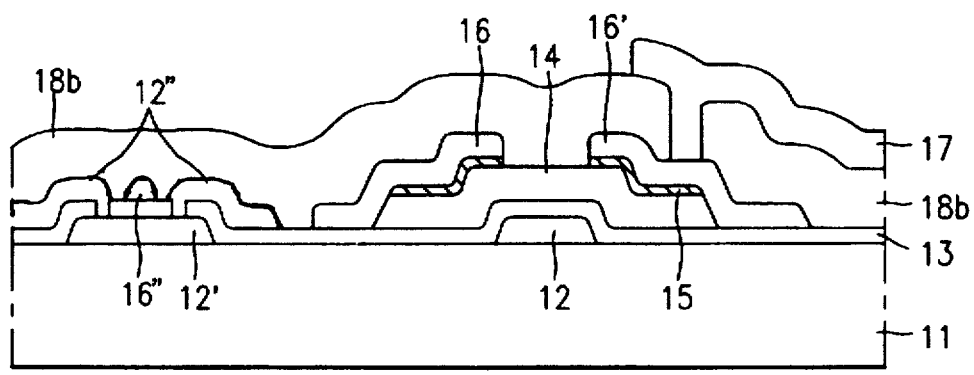

Another variation of the first embodiment is shown in FIG. 3E, which is similar to the previous variation shown in FIG. 3D, except that the protective film 18b is deposited instead of the interlayer insulating film 18a. The protective film 18b is formed on the entire surface, typically much thinner than the interlayer insulting layer 18a, and planarization is carried out. Subsequently, a contact hole exposing a part of the drain electrode is formed in the protective film 18b. A transparent conductive layer is formed on the entire surface and patterned to a predetermined pattern, thereby forming the pixel electrode 17.

A second embodiment of the present invention will be described below with reference to FIGS. 4A, 4B, and 5A to 5E.

Figure 4A:
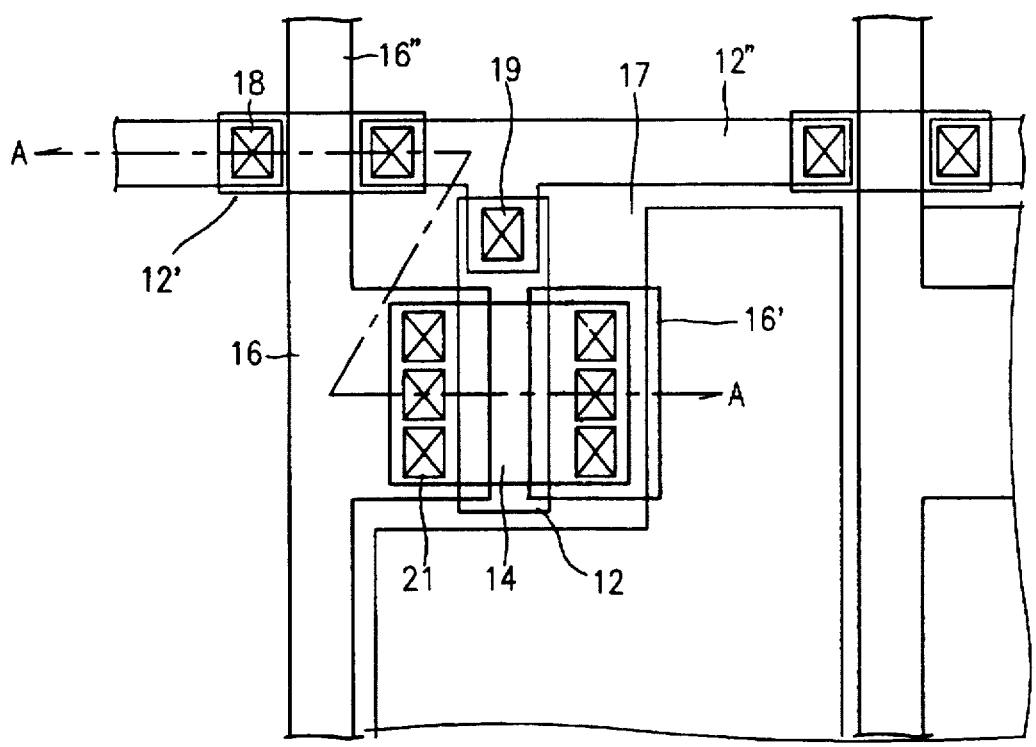
FIGS. 4A and 4B are plan and cross sectional views showing the structure of a liquid crystal display device according to a second embodiment of the present invention.
Figure 4B:
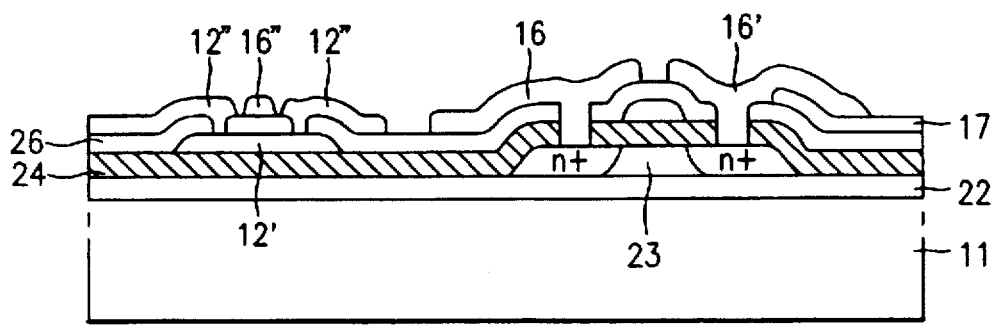

FIG. 4A is a plan view of the second embodiment of the present invention. FIG. 4B shows a cross-sectional view taken along line III-III' in FIG. 4A. The structure shown in FIGS. 4A and 4B is a top gate structure of a coplanar TFT.

In the liquid crystal display device according to the second embodiment of the present invention, a scanning line includes a first scanning line part 12' and a second scanning line part 12". The first scanning line part 12' crosses a signal line 16". A gate electrode 12 is formed of a high refractory metal or a polysilicon doped with high concentration impurity (n⁺polysilicon). The signal line 16" a source electrode 16, a drain electrode 16' and the second scanning line 12" part are formed of a low resistance metal. The second scanning line 12" is connected to the first scanning line part 12' through a scanning line contact hole 18. A gate electrode 12 is connected to the second scanning line 12" through a gate electrode contact hole 19. A source electrode 16 and a drain electrode 16' are connected to the source and drain regions of an active layer 23 through source and drain contact holes 21. Here, the size of the source and drain contact holes 21 is, for example, 1×1 μm to 10×10 μm. The number of the contact holes 21 can be more than one as shown in FIG. 4A so as to lower the contact resistance. Further, any contact hole in the first and second embodiments may be replaced with multiple contact holes to lower the contact resistance.

The second scanning line 12" is formed between the two signal lines (see FIG. 4A). The first scanning line part 12' is formed to be longer than the width of the signal line 16", providing a bridge structure at the intersection between the scanning line and the signal line 16". The first scanning line part 12' is connected to the second scanning line part 12" through the scanning line contact hole 18. The second scanning line part 12" also has a projecting part for making contact with the gate electrode 12 through the gate electrode contact hole 19.

The liquid crystal display device includes an insulating substrate 11, a pixel electrode 17, a buffer layer 22, an active layer 23, a gate insulating film 24, and an interlayer insulating film 26.

Figure 5A:
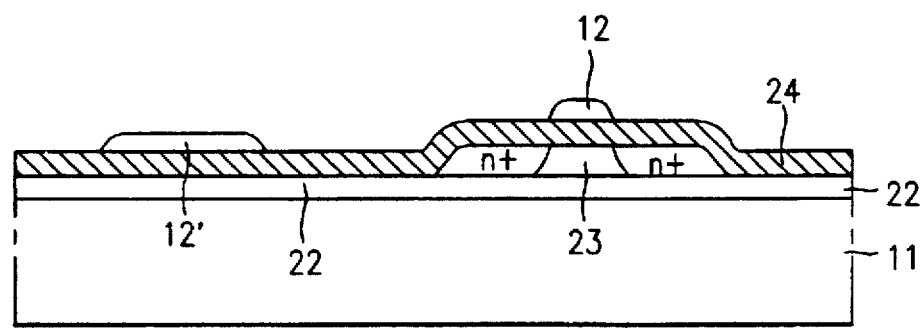
FIGS. 5A to 5E are cross sectional views illustrating a method for manufacturing the liquid crystal display device according to the second embodiment of the present invention.

A method for manufacturing the liquid crystal display device according to the second embodiment of the present invention will be described below with reference to FIGS. 5A to 5E. As shown in FIG. 5A, a buffer layer 22, such as an oxide film or a nitride film, is formed on an insulating substrate 11. A semiconductor layer, such as polysilicon or amorphous silicon, is formed thereon and patterned to form an active layer 23 of a thin film transistor. Then, a gate insulating film 24 is formed on the entire resultant surface. On the gate insulating film 24, a high refractory metal layer including a metal silicide or any one of Cr, Ta, W and Ti, or a polysilicon doped with a high concentration of impurity (n⁺polysilicon) is deposited and patterned to form a first scanning line part 12' and a gate electrode 12. Here, the first scanning line part 12' is formed such that it crosses a signal line to be formed in a later process.

Figure 5B:
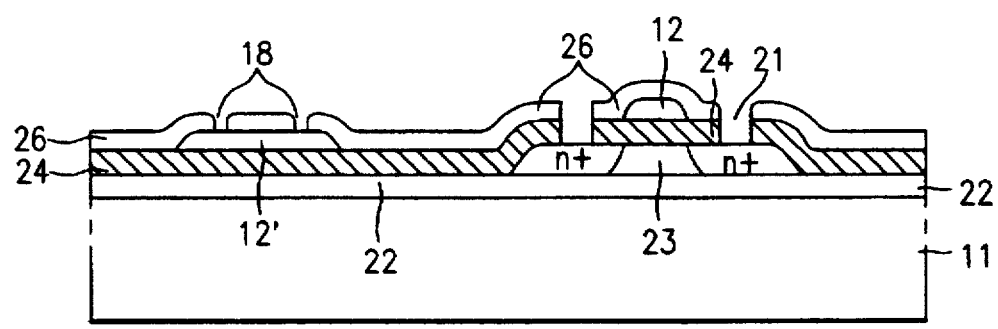

As shown in FIG. 5B, by doping with high concentration impurities, source and drain regions are formed on both ends of the active layer 23. Then, an interlayer insulating film 26 is formed on the entire surface. The interlayer insulating film 26 and the gate insulating film 24 are selectively etched to form a scanning line contact hole 18 exposing a predetermined part of the first scanning line part 12', a gate electrode contact hole (not shown) exposing a predetermined part of the gate electrode 12, and source and drain contact holes 21 exposing source and drain regions.

Figure 5C:
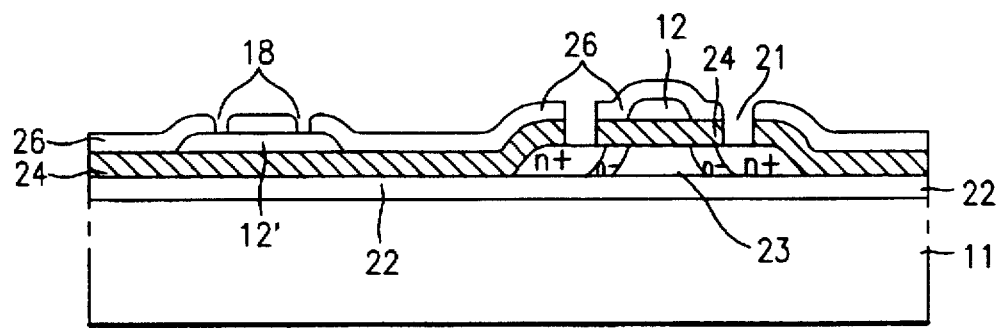

At this time, as shown in FIG. 5C, before implanting high concentration impurity ions, a low concentration impurity ions may be implanted to form a lightly doped drain (LDD) region.

Figure 5D:
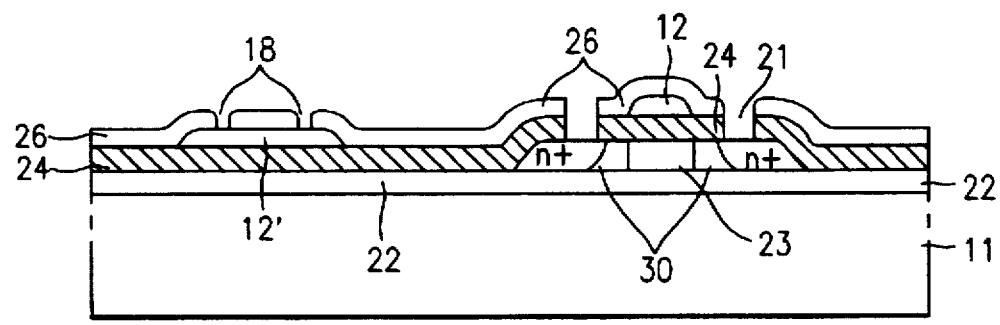

Alternatively, as shown in FIG. 5D, an offset region where no impurity ion is implanted may be formed between the channel and the source and drain regions.

Figure 5E:
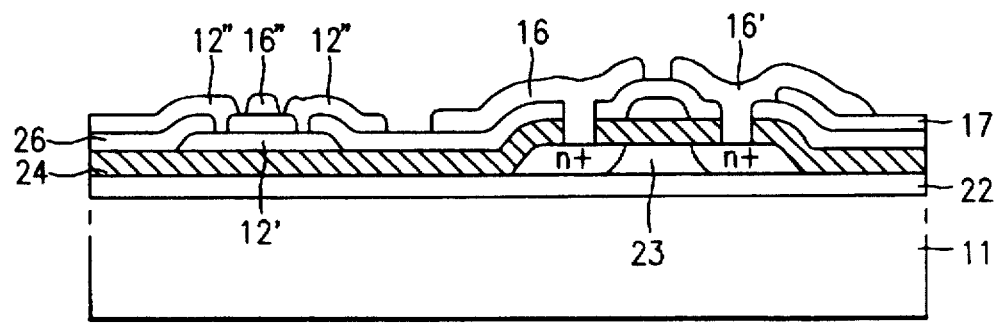

Then, as shown in FIG. 5E, a transparent conductive layer is formed and patterned to form a pixel electrode 17. Then, a low resistance metal layer is formed on the entire surface of the substrate and patterned to form a signal line 16", a second scanning line part 12", a source electrode 16, and a drain electrode 16'. The second scanning line part 12" is connected to the first scanning line part 12' through the scanning line contact hole 18 and to the gate electrode 12 through the gate electrode contact hole 19. The source and drain electrodes 16 and 16' are connected to the source and drain regions through the source and drain contact holes 21.

As another method, the pixel electrode 17 may be formed after forming source and drain electrodes and an insulating film thereon. Further, the pixel electrode may be formed after forming a protecting film for passivation in a later process.

A third embodiment of the present invention will be described below with reference to FIGS. 6A to 6C.

A thin film transistor of a liquid crystal device according to the third embodiment of the present invention has a similar structure as in the first embodiment of the invention, i.e., a bottom gate type transistor but having an etch stopper for source and drain regions.

Figure 6A:
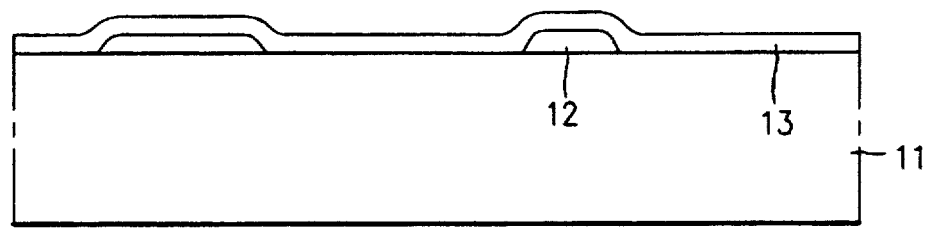
FIGS. 6A to 6C are cross sectional views illustrating a method for manufacturing the liquid crystal display device according to a third embodiment of the present invention.

As shown in FIG. 6A, as a high refractory metal layer, any one selected from the group of Cr, Ta, W and Ti is deposited on an insulating substrate 11, and then patterned to form a gate electrode 12 and a first scanning line part 12'. A gate insulating film 13 is formed on an entire resultant surface. Here, first scanning line part 12' is formed such that it crosses a signal line to be formed in a later process.

Figure 6B:
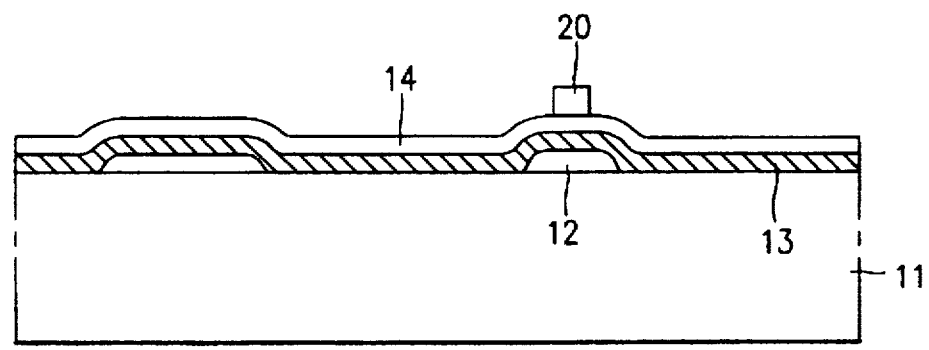

As shown in FIG. 6B, a semiconductor layer 14 and an insulating film are sequentially formed on the gate insulating film 13. The insulating film is patterned to form an etch stopper 20 over the gate electrode 12.

Figure 6C:
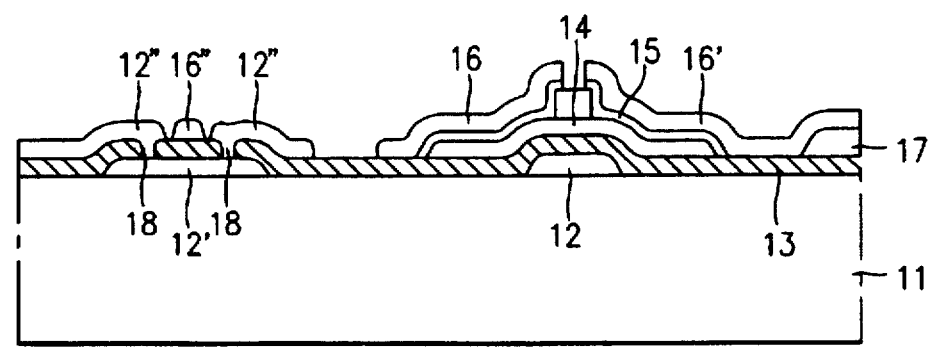

As shown in FIG. 6C, an ohmic contact layer 15 is formed over the substrate. Then, the semiconductor layer 14 and the ohmic contact layer 15 are patterned to form an active pattern for the transistor. A transparent conductive layer is deposited and patterned to form a pixel electrode 17. Then, the gate insulating film 13 is selectively etched to form a scanning line contact hole 18 exposing a predetermined part of the first scanning line part 12' and a gate electrode contact hole (not shown) exposing a predetermined part of the gate electrode 12.

Then, a low resistance metal layer is formed on the entire surface and patterned to form a signal line 16", a second scanning line 12". The second scanning line part 12" is connected to the first scanning line part 12' through the scanning line contact hole 18 and to the gate electrode 12 through the gate electrode contact hole.

Then, using the source and drain electrodes as a mask, the impurity-doped semiconductor layer formed over the channel region is removed.

As another method, the pixel electrode 17 may be formed after forming the source and drain electrodes and an insulating film thereon. Further, the pixel electrode may be formed after forming a protecting film for passivation in a later process.

As described above, the following effects can be obtained by forming the gate electrode and the scanning line of the liquid crystal display device according to the present invention.

In the present invention, the first scanning line part crossing the signal line and the gate electrode are formed of a high refractory metal. This overcomes the problem in the prior art where if the scanning line and the gate electrode are formed of a low resistance metal having a low melting point, a hillock is generated. The second scanning line, the signal line, and the source and drain electrodes are formed of a low resistance metal, thereby reducing the time delay of the scanning line. Thus, it is possible to realize a TFT-LCD having large area and high definition.

Further, if the conventional gate electrode and the scanning line are formed of a low resistance metal having a low melting point, an anode oxidation process can be used to solve the hillock problem. In this case, however, a photo process for pad blocking, an anode oxidation process, and a cleaning process are added to the entire process. Moreover, a photoresist blocking the pad may fall off during the anode oxidation process, which causes the anode oxide film to be uneven, thereby reducing the yield. According to the present invention, since a series of such processes are unnecessary, the entire process is simplified with respect to the prior art process. Thus, the manufacturing cost is reduced while the yield is improved.

It will be apparent to those skilled in the art that various modifications and variations can be made in the liquid crystal display device and method for manufacturing same of the present invention without departing from the spirit or scope of the invention. Thus, it is intended that the present invention cover the modifications and variations of this invention provided they come within the scope of the appended claims and their equivalents.

What is claimed is:

1. A liquid crystal display device having a transistor comprising:

a substrate;

an insulating layer over the substrate, the insulating layer having a contact hole;

at least one scanning line, the one scanning line including a first scanning line part and a second scanning line part, the first scanning line part contacting the second scanning line part through the contact hole; and at least one signal line over the insulating layer and crossing the at least one scanning line at the first scanning line part, wherein the first scanning line part includes a first conductive material having a first resistance, and the second scanning line part and the at least one signal line include a second conductive material having a second resistance, the second resistance being lower than the first resistance.

2. The liquid crystal display device according to claim 1, wherein the first scanning line part includes a high refractory metal.

3. The liquid crystal display device according to claim 1, wherein the first scanning line part includes an impurity-doped polysilicon.

4. The liquid crystal display device according to claim 1, wherein the first scanning line part includes a metal silicide.

5. The liquid crystal display device according to claim 1, wherein the first scanning line part includes one of Cr, Ta, W, and Ti.

6. The liquid crystal display device according to claim 1, wherein the second conductive material includes a low resistance conductive material.

7. The liquid crystal display device, according to claim 1, wherein the substrate is an insulating substrate.

8. The liquid crystal display device according to claim 1, wherein the contact hole has a size in a range of approximately 1 μm×1 μm to 10 μm×10 μm.

9. The liquid crystal display device according to claim 1, wherein the first scanning line part is longer than a width of the at least one signal line.

10. A liquid crystal display device comprising:

a substrate;

an insulating layer over the substrate, the insulating layer having first and second contact holes;

at least one scanning line, the one scanning line having a first scanning line part and a second scanning line part;

at least one signal line crossing the at least one scanning line at the first scanning line part;

a thin film transistor having a gate electrode, a source electrode, and a drain electrode over the substrate; and a pixel electrode connected to one of the source and drain electrodes, wherein the first scanning line part and the gate electrode include a first conductive material having a first resistance;

the at least one signal line, the source and drain electrodes of the thin film transistor, and the second scanning line part include a second conductive material having a second resistance, the second resistance being lower than the first resistance; and the second scanning line part contacts the first scanning line part through the first contact hole and the gate electrode through the second contact hole.

11. The liquid crystal display device according to claim 10, wherein the first conductive material includes a high refractory metal.

12. The liquid crystal display device according to claim 10, wherein the first conductive material includes an impurity-doped polysilicon.

13. The liquid crystal display device according to claim 10, wherein the first conductive material includes a metal silicide.

14. The liquid crystal display device according to claim 10, wherein the first conductive material includes one of Cr, Ta, W, and Ti.

15. The liquid crystal display device according to claim 10, wherein the second scanning line part includes a low resistance conductive material.

16. The liquid crystal display device according to claim 10, wherein the substrate is an insulating substrate.

17. The liquid crystal display device according to claim 10, wherein the contact holes have a size in a range of approximately 1 µm×1 µm to 10 µm×10 µm.

18. The liquid crystal display devise according to claim 10, wherein the first scanning line part is longer than a width of the at least one signal line.

19. A method for manufacturing a liquid crystal display device having a transistor, the method comprising the steps of:

forming an insulating film over the substrate, the insulating film having a contact hole;

forming at least one scanning line having a first scanning line part and a second scanning line part, the second scanning line part contacting the first scanning line part through the contact hole; and forming at least one signal line over the insulating film, the at least one signal line crossing the first scanning line part, wherein the first scanning line part includes a first conductive material having a first resistance, and the second scanning line part and the at least one signal line include a second conductive material having a second resistance, the second resistance being lower than the first resistance.

20. The method of manufacturing a liquid crystal display device according to claim 19, wherein the first scanning line part includes a high refractory metal.

21. The method of manufacturing a liquid crystal display device according to claim 19, wherein the first scanning line part includes an impurity-doped polysilicon.

22. The method of manufacturing a liquid crystal display device according to claim 19, wherein the first scanning line part includes a metal silicide.

23. The method of manufacturing a liquid crystal display device according to claim 19, wherein the first scanning line part includes one of Cr, Ta, W, and Ti.

24. The method of manufacturing a liquid crystal display device according to claim 19, wherein the second conductive material includes a low resistance conductive material.

25. The method of manufacturing a liquid crystal display device according to claim 19, wherein the substrate is an insulating substrate.

26. The method of manufacturing a liquid crystal display device according to claim 19, wherein the contact hole is formed to a size in a range of approximately 1 µm×1 µm to 10 µm×10 µm.

27. The method of manufacturing a liquid crystal display device according to claim 19, wherein the first scanning line part is longer than a width of the at least one signal line.

28. A method for manufacturing a liquid crystal display device having a thin film transistor, the method comprising the steps of:

forming an insulating film over the substrate, the insulating film having first and second contact holes;

forming at least one scanning line, the one scanning line having a first scanning line part and a second scanning line;

forming at least one signal line crossing the scanning line at the first scanning line part;

forming a thin film transistor having a gate electrode, a source electrode, and a drain electrode over the substrate; and forming a pixel electrode connected to one of the source electrode and the drain electrode, wherein the first scanning line part and the gate electrode include a first conductive material having a first resistance;

the at least one signal line, the source and drain electrodes of the thin film transistor, and the second scanning line part include a second conductive material having a second resistance, the second resistance being lower than the first resistance; and the second scanning line part contacts the first scanning line part through the first contact hole and contacts the gate electrode through the, second contact hole.

29. The method of manufacturing a liquid crystal display device according to claim 28, wherein the first conductive material includes a high refractory metal.

30. The method of manufacturing a liquid crystal display device according to claim 28, wherein the first conductive material includes an impurity-doped polysilicon.

31. The method of manufacturing a liquid crystal display device according to claim 28, wherein the first conductive material includes a metal silicide.

32. The method of manufacturing a liquid crystal display device according to claim 28, wherein the first conductive material includes one of Cr, Ta, W, and Ti.

33. The method of manufacturing a liquid crystal display device according to claim 28, wherein the second conductive material includes a low resistance material.

34. The method of manufacturing a liquid crystal display device according to claim 28, wherein the substrate is an insulating substrate.

35. The method of manufacturing a liquid crystal display device according to claim 28, wherein the contact holes are formed to a size in a range of approximately 1 µm×1 µm to 10 µm×10 µm.

36. The method of manufacturing a liquid crystal display device according to claim 28, wherein the first scanning line part is longer than a width of the at least one signal line.

* * * * *

UNITED STATES PATENT AND TRADEMARK OFFICE
CERTIFICATE OF CORRECTION

PATENT NO. : 5,793,460
DATED : August 11, 1998
INVENTOR(S) : Myoung-Su YANG

It is certified that error appears in the above-identified patent and that said Letters Patent is hereby corrected as shown below:

Column 10, line 41, change "the, second" to --the second--.

Signed and Sealed this

Sixteenth Day of February, 1999

Attest:

Attesting Officer

*Acting Commissioner of Patents and Trademarks*